United States Patent [19]
Jimenez

[11] Patent Number: 5,357,126
[45] Date of Patent: Oct. 18, 1994

[54] MOS TRANSISTOR WITH AN INTEGRATED PROTECTION ZENER DIODE

[75] Inventor: Jean Jimenez, Voiron, France

[73] Assignee: SGS-Thomson Microelectronics S.A., Saint-Genis Pouilly, France

[21] Appl. No.: 978,777

[22] Filed: Nov. 19, 1992

[30] Foreign Application Priority Data

Nov. 21, 1991 [FR] France ................. 91 14753

[51] Int. Cl.$^5$ ........................................ H01L 27/02
[52] U.S. Cl. ........................... 257/173; 257/175; 257/355; 257/373; 257/547; 257/603
[58] Field of Search .............. 257/373, 547, 603, 173, 257/355

[56] References Cited

U.S. PATENT DOCUMENTS

| | | |
|---|---|---|
| 4,862,233 | 8/1989 | Matsushita et al. .............. 257/328 |
| 5,008,723 | 4/1992 | van der Have . |
| 5,103,425 | 4/1992 | Kuo et al. ........................ 257/603 |

OTHER PUBLICATIONS

Patent Abstracts of Japan, vol. 8, No. 261.
Patent Abstracts of Japan, vol. 9, No. 136.
Electrical Overstress/Electrostatic Discharge Symposium Proceedings, 1984, Philadelphia, Pa., USA, pp. 202-209, "A CMOS VLSI ESO Input Protection Device, DIFIDW", Lin Chong Ming, et al., p. 203.

Primary Examiner—Edward Wojciechowicz
Attorney, Agent, or Firm—Wolf, Greenfield & Sacks

[57] ABSTRACT

A MOS transistor is formed in a first low-doped P-type retion coating a second more highly doped P-type region. The transistor comprises an N-type drain region, an N-type source region, and a region contacting the for region. The drain, cource and contacting regions are formed at the surface of the first region. The source and contacting regions are interconnected. An N-type highly doped region extends from the drain region through the first low-doped P-type region to the second more highly doped P-type region.

37 Claims, 1 Drawing Sheet

MOS TRANSISTOR WITH AN INTEGRATED PROTECTION ZENER DIODE

BACKGROUND OF THE INVENTION

1. Field of the Invention

The present invention relates to MOS transistors and more particularly to the protection of output MOS transistors included in integrated circuits against overvoltages such as electrostatic pulses.

2. Discussion of the Related Art

FIG. 1 is a cross-sectional view of an exemplary conventional structure of an N-channel MOS transistor used in an integrated circuit. The MOS transistor comprises a conductive gate region 1 on an isolating gate layer 2. On both sides of the gate region are formed an N+ drain region 3 and an N+ source region 4, respectively. These regions are formed in a low doped P-type region, layer or well 5, in turn formed on a highly doped P-type layer or substrate 6. During operation of the MOS transistor, regions 5 and 6 are biased at a reference voltage. A highly doped P-type region 7 contacts region 5.

FIG. 2 shows a conventional output stage of a MOS integrated circuit of the CMOS (complementary MOS) type. This stage comprises an N-type MOS (NMOS) transistor having its source terminal connected to a low voltage or reference voltage Vss in series with a P-channel MOS (PMOS) transistor having its source terminal connected to a high voltage Vdd. The common drain of transistors NMOS and PMOS forms the output which is provided at terminal A. Thus, output terminal A is at a high voltage when the PMOS transistor only is conductive and is at a low voltage when the NMOS transistor only is conductive.

When the N-channel MOS transistor of FIG. 1 is used as the NMOS transistor of FIG. 2, its drain region 3 is connected to output A. The source region 4 and the substrate contacting region 7 (which are in contact with each other) are interconnected to low voltage Vss. G designates the gate terminal of the NMOS transistor of FIG. 2.

A problem exists in that a MOS transistor includes a parasitic bipolar transistor, the collector of which corresponds to drain region 3, the emitter to source region 4, and the base to region 5. Owing to the presence of the resistive connection between the base (region 5) and the emitter (region 4), this transistor can go into avalanche mode when the current in region 5 becomes high, which may occur due to a current surge caused by an electrostatic pulse from the supply terminal Vdd or output terminal A. This avalanching mode can, if no current clipping is provided, cause the destruction of the component resulting either from destruction of the gate isolating layer 2 or piercing of the drain junction resulting from the migration of the drain metallization coating (not shown).

Therefore, various protection circuits have been provided in the prior art to avoid these problems.

SUMMARY OF THE INVENTION

The invention provides for achievement of a protection circuit using a simple integrated structure that does not complicate the manufacturing process of the NMOS transistor.

To achieve this object and others, the invention provides a MOS transistor formed in a first low-doped region of a first conductivity type coating a second more highly doped region of the first conductivity type comprising a drain region of the second conductivity type, a source region of the second conductivity type, and a region contacting the first region. The drain, source and contacting regions are formed at the surface of the first region, the source region and contacting region being interconnected. The transistor further comprises a highly doped region of the second conductivity type extending through the first low-doped region from a portion of the drain region to the second more highly doped region.

According to an embodiment of the invention, the first conductivity type is P-type.

According to an embodiment of the invention, the MOS transistor forms the output of a MOS circuit.

The foregoing and other objects, features, aspects and advantages of the invention will become apparent from the following detailed description of the present invention which should be read in conjunction with the accompanying drawings.

BRIEF DESCRIPTION OF THE DRAWINGS

As conventional in semiconductor representation, FIGS. 1 and 3 are schematic, and the thickness and dimensions of the various layers and regions are not drawn to scale.

DETAILED DESCRIPTION

Figure 1:
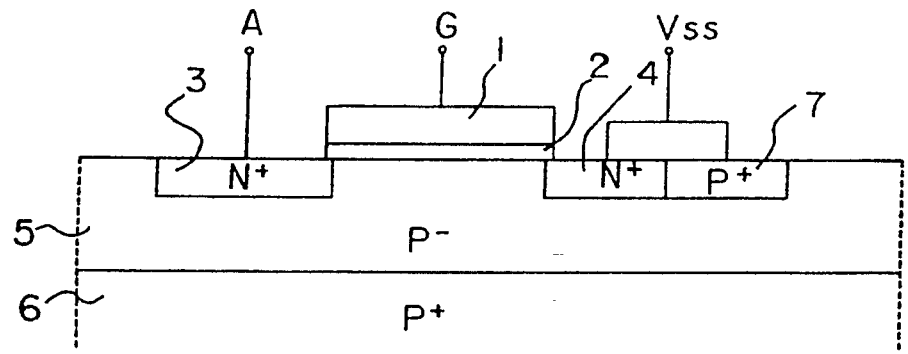
FIGS. 1 and 2, above described, illustrate the state of the art and the problem encountered.
Figure 3:
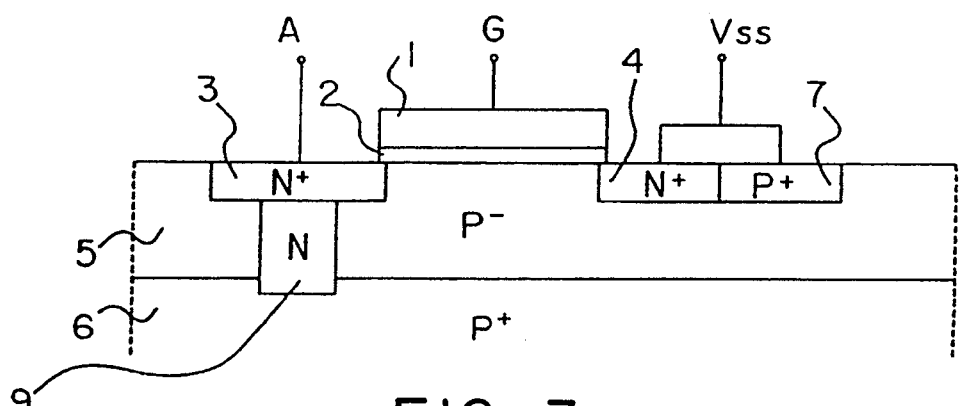
FIG. 3 shows a schematic cross-sectional view of an NMOS transistor according to the invention.

FIG. 3 shows the same elements as FIG. 1 designated with the same reference numerals. According to the invention, connecting between drain region 3 and the P+ layer 6 is a highly doped N-type region 9, so that the interface between region 9 and region 6 forms a breakdown voltage zener diode. The breakdown voltage is chosen to be higher than voltage Vdd, and may be for example, approximately 12 volts. Thus, when a current surge occurs at terminal A, the zener diode breaks down far from the surface, so that carriers generated by the avalanche are not likely to be drawn by the gate (electrons go back to the drain and holes to the substrate). Furthermore, since this additional N+ diffusion 9 is relatively deep, for example, approximately several $\mu$m in conventional structures, the likelihood that the junction will be destroyed by the metal contacting it is very low.

Figure 2:
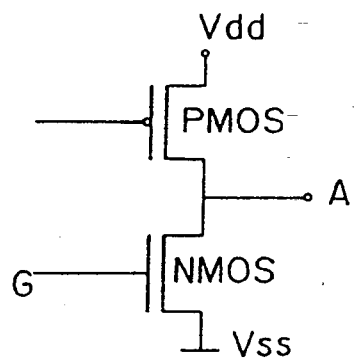

Since the invention relates to NMOS transistors forming an output stage as shown in FIG. 2, and since these transistors have a relatively large surface area, there is enough room available to form this deep N region through, for example, diffusion. The junction surface between the N-type region 9 and P-type region 6 can be selected by those skilled in the art so as to be large enough to rapidly evacuate the charges resulting from a current surge, yet not to be oversized in order to avoid unduly increasing the drain-substrate capacitance of the MOS transistor. Indeed, for a like junction surface, an N+P junction has a larger capacitance than an N+P− junction.

When using a complex integrated circuit of the BICMOS-type comprising bipolar and MOS transistors, the fabrication of a structure according to the invention does not require any additional manufacturing step. In practice, there generally are in the bipolar portion of the circuit, especially in vertical NPN transistors, deep N+ diffusions for purposes of contacting a buried layer corresponding to an N+-type collector at the bottom of an N well. This deep N+ diffusion may also be used as a guard ring around various N wells.

As is apparent to those skilled in the art, various modifications can be made to the above disclosed preferred embodiments. In particular, the MOS transistor is shown very succinctly and the various improvements generally brought to MOS transistor structures can be adapted to the invention. Moreover, the invention has been described in connection with an NMOS transistor. The invention can also apply to PMOS transistors by inverting all the above-mentioned polarity types. Accordingly, the foregoing description is by way of example only and is not intended as limiting. The invention is limited only as defined in the following claims and the equivalents thereto.

I claim:

1. A lateral MOS transistor, comprising:
    a substrate including a first low-doped surface layer of a first conductivity type substantially coating a second more highly-doped underlying layer of the first conductivity type;
    a drain region of a second conductivity type formed in the first surface layer;
    a source region of the second conductivity type formed in the first surface layer;
    a substrate contacting region formed in the first surface layer; and
    a region of the second conductivity type extending through the surface layer from a portion of the drain region to the underlying layer.

2. The MOS transistor of claim 1, wherein the source region, the drain region, and the substrate contacting region are formed in the first surface layer at a surface of the first surface layer.

3. The MOS transistor of claim 2, wherein the region of the second conductivity type extending through the first surface layer from a portion of the drain region to the second underlying layer comprises a highly-doped region of the second conductivity type.

4. The MOS transistor of claim 3, wherein the first conductivity type comprises P-type.

5. The MOS transistor of claim 4, wherein the second conductivity type comprises N-type.

6. The MOS transistor of claim 3, wherein the first conductivity type comprises N-type.

7. The MOS transistor of claim 6, wherein the second conductivity type comprises P-type.

8. The MOS transistor of claim 1, wherein the transistor is used as an output stage of a MOS type integrated circuit.

9. The MOS transistor of claim 1, wherein the transistor is constructed as an integrated circuit.

10. The MOS transistor of claim 1, wherein the substrate contacting region and the source region are interconnected.

11. A MOS integrated circuit output stage, comprising:
    a first lateral MOS transistor having a first source terminal coupled to a first voltage source;
    a second lateral MOS transistor having a second source terminal and a second drain terminal, the second source terminal coupled to a second voltage source;
    an output terminal coupled to the first drain terminal and the second drain terminal;
    wherein at least one of the first and second lateral MOS transistors comprises:
        a substrate including a first low-doped surface layer of a first conductivity type substantially coating a second more highly-doped underlying layer of the first conductivity type;
        a drain region of a second conductivity type formed in the first surface layer;
        a source region of the second conductivity type formed in the first surface layer; and
        a region of the second conductivity type extending through the surface layer from a portion of the drain region to the underlying layer.

12. The MOS integrated circuit of claim 11, further comprising:
    a substrate contacting region formed in the first surface layer and interconnected to the source region.

13. The MOS integrated circuit of claim 12, wherein the source region, the drain region, and the substrate contacting region are formed in the first surface layer at a surface of the first surface layer.

14. The MOS integrated circuit of claim 13, wherein the region of the second conductivity type extending through the first surface layer from a portion of the drain region to the second underlying layer comprises a highly-doped region of the second conductivity type.

15. The MOS integrated circuit of claim 14, wherein the first conductivity type comprises P-type.

16. The MOS integrated circuit of claim 15, wherein the second conductivity type comprises N-type.

17. The MOS integrated circuit of claim 14, wherein the first conductivity type comprises N-type.

18. The MOS integrated circuit of claim 17, wherein the second conductivity type comprises P-type.

19. A lateral MOS transistor including a substrate having a first low-doped surface layer of a first conductivity type coating a second more highly-doped underlying layer of the first conductivity type, a drain region of a second conductivity type formed in the first surface layer; a source region of the second conductivity type formed in the first surface layer, the improvement comprising:
    a region of the second conductivity type extending through the surface layer from a portion of the drain region to the underlying layer.

20. The MOS transistor of claim 19, further comprising:
    a substrate contacting region formed in the first surface layer and interconnected to the source region.

21. The MOS transistor of claim 20, wherein the source region, the drain region, and the substrate contacting region are formed in the first surface layer at a surface of the first surface layer.

22. The MOS transistor of claim 21, wherein the region of the second conductivity type extending through the first surface layer from a portion of the drain region to the second underlying layer comprises a highly-doped region of the second conductivity type.

23. The MOS transistor of claim 22, wherein the first conductivity type comprises P-type.

24. The MOS transistor of claim 23, wherein the second conductivity type comprises N-type.

25. The MOS transistor of claim 22, wherein the first conductivity type comprises N-type.

26. The MOS transistor of claim 25, wherein the second conductivity type comprises P-type.

27. A lateral MOS transistor, comprising:

a substrate including a first low-doped surface layer of a first conductivity type substantially coating a second more highly-doped underlying layer of the first conductivity type;

a drain region of a second conductivity type formed in the first surface layer;

a source region of the second conductivity type formed in the first surface layer; and a region of the second conductivity type extending through the surface layer from a portion of the drain region to the underlying layer.

28. The MOS transistor of claim 27, further comprising a substrate contacting region formed in the first surface layer.

29. The MOS transistor of claim 28, wherein the source region, the drain region, and the substrate contacting region are formed in the first surface layer at a surface of the first surface layer.

30. The MOS transistor of claim 29, wherein the region of the second conductivity type extending through the first surface layer from a portion of the drain region to the second underlying layer comprises a highly-doped region of the second conductivity type.

31. The MOS transistor of claim 30, wherein the first conductivity type comprises P-type.

32. The MOS transistor of claim 31, wherein the second conductivity type comprises N-type.

33. The MOS transistor of claim 30, wherein the first conductivity type comprises N-type.

34. The MOS transistor of claim 33, wherein the second conductivity type comprises P-type.

35. The MOS transistor of claim 27, wherein the transistor is used as an output stage of a MOS type integrated circuit.

36. The MOS transistor of claim 27, wherein the transistor is constructed as an integrated circuit.

37. The MOS transistor of claim 28, wherein the substrate contacting region is interconnected to the source region.

* * * * *